United States Patent [19]

Jeng et al.

[11] Patent Number: 5,789,270
[45] Date of Patent: Aug. 4, 1998

[54] METHOD FOR ASSEMBLING A HEAT SINK TO A DIE PADDLE

[75] Inventors: Jian Dih Jeng, Hsin-Chu; Hsing Seng Wang, Tau Yuan, both of Taiwan

[73] Assignee: Industrial Technology Research Institute, Hsinchu, Taiwan

[21] Appl. No.: 594,254

[22] Filed: Jan. 30, 1996

[51] Int. Cl.⁶ .................................................. H01L 21/60
[52] U.S. Cl. ........................ 437/209; 437/211; 437/214; 437/219; 437/902
[58] Field of Search ........................ 437/209, 211, 437/214, 217, 218, 219, 220, 902

[56] References Cited

U.S. PATENT DOCUMENTS

| 5,091,341 | 2/1992 | Asada et al. ............. 437/902 |
| 5,147,821 | 9/1992 | McShane et al. . |
| 5,200,809 | 4/1993 | Kwon . |
| 5,202,288 | 4/1993 | Doering et al. ............. 437/902 |
| 5,438,478 | 8/1995 | Kondo et al. ............. 437/902 |
| 5,444,025 | 8/1995 | Sono et al. ............. 437/217 |

OTHER PUBLICATIONS

Jian D. Jeng et al., U.S.S.N. 08/594,497, Method For Bonding A Heat Sink To A Die Paddle, Filed: Jan. 31, 1996.

Shailesh Mulgaonker et al., Thermal Performance Limits of The QFP Family, Aug. 1993, Ninth IEEE Semi-Therm Symposium.

*Primary Examiner*—Kevin Picardat
*Attorney, Agent, or Firm*—Barnes, Kisselle, Raisch, Choate, Whittemore & Hulbert, P.C.

[57] ABSTRACT

A method of assembly an integrated circuit die to a heat sink by first providing a lead frame that has a die-attach paddle portion having a top surface, a bottom surface, and an opening therethrough, positioning a heat sink having a raised portion on its top surface abutting the bottom surface of the die-attach paddle portion, and then frictionally engaging the heat sink and the die-attach paddle together and bonding an integrated circuit chip to the top surface of the heat sink with an adhesive material sandwiched therein between such that the assembly can be placed in a mold apparatus for forming a plastic encapsulated package.

19 Claims, 2 Drawing Sheets

METHOD FOR ASSEMBLING A HEAT SINK TO A DIE PADDLE

FIELD OF THE INVENTION

The present invention generally relates to a method for electronic device packaging and more particularly, relates to a method for electronic device packaging wherein a heat sink is assembled to a die paddle.

BACKGROUND OF THE INVENTION

An important step in the manufacturing of integrated circuits is packaging during which an IC chip is encased in a metal, ceramic or plastic enclosure. A metal package or a ceramic package provides excellent heat dissipation properties, however, they are expensive and labor intensive packaging techniques. For instance, in a ceramic package, the use of two ceramic substrates represents a significant portion of the total cost of fabricating the IC device.

As the production volume for semiconductor devices grew, the development of more cost effective packages becomes increasingly important. One of such cost effective packages developed in recent years is a plastic molded package or sometimes called a plastic quad flat package (PQFP). Although a plastic molded package presents significant fabrication cost advantages, the desirable heat dissipation property that is inherent in a metal or ceramic package is lost. The shortcoming of the poor heat dissipation property in a plastic molded package becomes more severe in the more recently developed IC devices.

In modern IC devices, the density of a device has greatly increased. This is because in these devices, the chip size has become smaller which means that the devices on the chip are being placed closer together. In order to maintain a reasonable service life of an IC device, the operating temperature of the device must be carefully controlled by providing adequate heat dissipation.

Another development in modern IC devices which further demands improved heat dissipation is the increasing use of higher power consumption circuits. For instance, in a conventional 208-pin PQFP device, only 1.0 watt power dissipation is required. The power dissipation, which is closely related to the heat dissipation property becomes more severe in a modern CPU or ASIC chip which requires 2 or 3 watts power dissipation capability. The heat dissipation property of a conventional plastic molded package therefore must be improved in order to accommodate the more densely packaged and the higher power consumption IC devices.

A heat sink normally made of a high thermal conductivity material has been used to fulfill the need for improving heat dissipation in plastic molded packages. The heat sink is sometimes called a heat spreader when a surface of the heat sink is unexposed to the ambient, also called a heat slug when a surface of the heat sink is exposed to the ambient. A heat sink is typically made of a material that has high thermal conductivity such as copper, copper alloys, aluminum, aluminum alloys or any other high thermal conductivity materials. The heat sink ideally should be in good thermal contact to a semiconductor die.

Attempts to improve the heat dissipation property of a plastic molded package have been made by others. One of such attempts is the use of adhesive tapes such as a polyimide tape between the lead frame and the heat sink. This is shown in FIG. 1. Polyimide tape 10 securely bonds lead frame 12 to heat sink 14. However, even though an intimate contact between a lead frame and a heat sink is achieved, the tape itself is a thermal insulator and therefore impedes the thermal conductance between the lead frame and the heat sink. Moreover, the application of the tape requires an additional processing step which is undesirable.

To improve the cooling efficiency of an integrated circuit encapsulated in a plastic molded package, an external add-on heat sink can be fixed tightly to the die paddle. This is shown in FIGS. 2a–2c. Such a package arrangement frequently includes an integrated circuit die 26 contained in a plastic molded package 28 by utilizing a lead frame 20 provided with a die paddle 22 portion (also called a die-attach or die-mounting paddle) to which an integrated circuit die 26 and a heat sink 24 are attached. A plastic molded package 28 is then molded around the lead frame 20 to encapsulate all the parts. During such an injection molding process, the die paddle 22 frequently bows away from the heat sink 24 which allows the injected plastic material to penetrate in between the die paddle 22 and the heat sink 24. The trapped plastic material acts as a heat insulator and deteriorates the heat dissipation property of the plastic molded package 28.

In yet another attempt to improve the heat dissipation between a die paddle and a heat sink, a vacuum passage is provided in a molding apparatus prior to the molding of the plastic package. This is shown in FIG. 3. In molding apparatus 40, an integrated circuit die 42 is placed on a die paddle 44 prior to the closing of the mold. A vacuum is then applied through vacuum passage 46 to the underside of the die paddle 44 such that the die paddle is pressed tightly against the heat sink 48. A plastic injection process is then performed to encapsulate the device in plastic. The method is effective in achieving a tight is contact between the die paddle and the heat sink. However, it requires the provision of complicated vacuum channels in the molding apparatus which increases the tooling cost and furthermore, the cycle time for molding.

In a copending application Ser. No. 08/594,255 assigned to the common assignee of the present invention, an improved method of bonding an integrated circuit die to a heat sink is disclosed. The method provides apertures in a die-attach paddle such that an IC die, a die-attach paddle, and a heat sink are bonded together by an adhesive in a die-bonding process. An adhesive filled with a conductive filler is required for the bonding process.

It is therefore an object of the present invention to provide a method of assembling a die-attach paddle to a heat sink that does not have the drawbacks and the shortcomings of the prior art methods.

It is another object of the present invention to provide a method of assembling a die-attach paddle to a heat sink in a plastic molded package that does not require the use of adhesive tapes.

It is a further object of the present invention to provide a method of assembling a die-attach paddle to a heat sink in a plastic molded package that does not require the addition of any processing step to a conventional process.

It is another further object of the present invention to provide a method of assembling a die-attach paddle to a heat sink in a plastic molded package without the need for modifying existing processing apparatus.

It is still another object of the present invention to provide a method of assembling a die-attach paddle to a heat sink in a plastic molded package by providing an opening in the paddle and a raised ridge portion on a top surface of the heat sink that is in contact with the die-attach paddle.

It is yet another object of the present invention to provide a method of assembling a die-attach paddle to a heat sink in a plastic molded package by frictionally engaging an opening in the die-attach paddle and a matching raised ridge portion on the heat sink together.

It is still another further object of the present invention to provide an integrated circuit device in a plastic molded package wherein a die-attach paddle is assembled to a heat sink by frictional engagement.

SUMMARY OF THE INVENTION

In accordance with the present invention, a method for assembling a heat sink to a die-attach paddle in a plastic molded package by providing an opening in the die-attach paddle such that the integrated circuit die and the heat sink can be assembled together in a die-bonding process. The heat sink is designed with a raised ridge portion on its top surface. The raised ridge portion has an external profile substantially matches the profile of the opening in the die-attach paddle. The raised ridge portion further has an external perimeter substantially equal to the inside perimeter of the opening. The heat sink frictionally engages the die-attach paddle by an engagement between the raised ridge portion and the opening in the die-attach paddle. The heat sink has a recessed area in its top surface inside the raised ridge portion adapted to receive an integrated circuit chip. An adhesive filled with a conductive filler is used between the integrated circuit die and the heat sink. The conductive filler added to the adhesive facilitates the thermal conductance between the IC die and the heat sink. The adhesive is an epoxy and filled with a metal powder, for instance, an epoxy filled with silver powder.

The present invention assembling process can be carried out without the drawbacks and shortcomings of the prior art methods. For instance, it does not require the use of adhesive tapes to bond the IC die to the die-attach paddle, and it does not require the provision of vacuum channels in the molding apparatus in order to hold the heat sink securely against the die-attach paddle. The process provides an assembly of a die-attach paddle and a heat sink by the frictional engagement between a heat sink and a die-attach paddle and the adhesive bonding between an integrated circuit chip and the heat sink. After a plastic injection molding process, a plastic molded package that has superior heat dissipation property is fabricated.

The present invention is also directed to an integrated circuit device that is packaged in a plastic molded package wherein a die-attach paddle is assembled to a heat sink by frictional engagement through a raised ridge portion in the top surface of the heat sink and an opening provided in the die-attach paddle. The plastic molded package may contain a single IC device or a multiple number of IC devices. When multiple number of IC devices are mounted, a substrate is first mounted to a heat sink by a conductive adhesive, the IC dies are then bonded to the substrate by another layer of the conductive adhesive.

BRIEF DESCRIPTION OF THE DRAWINGS

Other objects, features and advantages of the present invention will become apparent upon consideration of the specification and the appended drawings, in which:

FIG. 4b is an enlarged cross-sectional view of the heat sink shown in FIG. 4a.

FIG. 6b is an enlarged cross-sectional view of the die-attach paddle, the heat sink, and the integrated circuit shown in FIG. 6a.

DETAILED DESCRIPTION OF THE PREFERRED AND THE ALTERNATE EMBODIMENT

The present invention provides a method of fabricating a plastic molded package that has superior heat dissipation property by first assembling a die-attach paddle to a heat sink by frictional engagement, bonding an integrated circuit chip to a top surface of the heat sink, and then encapsulate all parts in a plastic molded package. The present invention method of forming plastic molded packages can be used for either a single IC chip or for multiple IC chips: In the case of a multiple number of IC chips, the substrate is first bonded to a heat sink and then the chips are bonded to a heat sink. The present invention is described in a preferred embodiment and an alternate embodiment.

In the preferred embodiment, a heat sink having a raised ridge portion in its top surface is frictionally engaged to a die-attach paddle that has an opening by mechanically engaging the ridge to the opening. The raised ridge portion has an external profile that is substantially the same as the profile of the opening in the die-attach paddle. It also has an external perimeter that is substantially equal to the inside perimeter of the opening. A recessed area in the top surface of the heat sink inside the raised ridge portion is adapted for receiving an integrated circuit chip.

In an alternate embodiment, the substrate is first bonded by a conductive adhesive to a heat sink, a multiple number of ICs are then bonded by the conductive adhesive to the substrate. The present invention further provides a plastic molded package that contains one or more IC dies that are bonded to a heat sink which is mechanically engaged with a die-attach paddle in a lead frame by the frictional engagement between a raised ridge on the heat sink and an opening in the die-attach paddle such that all three parts are securely assembled together. The plastic molded package fabricated by the present invention method provides superior heat dissipation properties.

Figure 1:
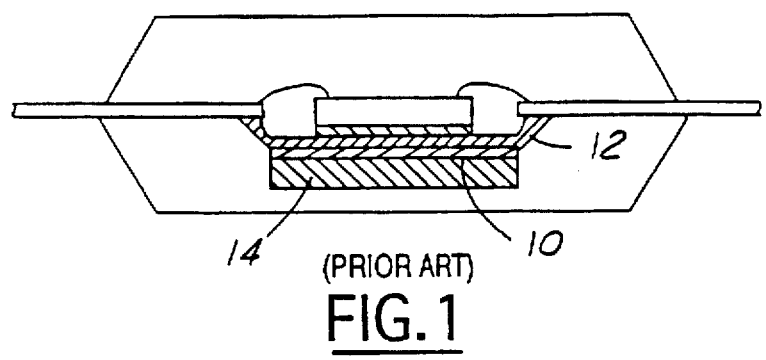
FIG. 1 is an enlarged cross-sectional view of a prior art plastic molded package utilizing adhesive tapes.
Figure 2A:
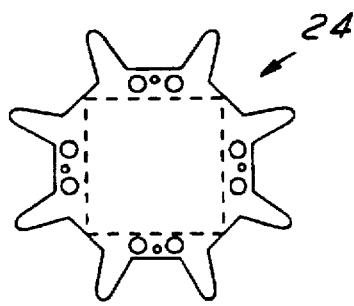
FIGS. 2a–2c are enlarged cross-sectional views of a second prior art method of using a heat sink equipped with dimples.
Figure 2B:
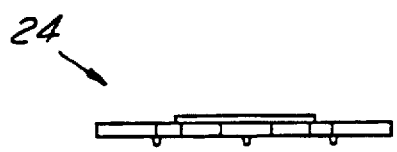
Figure 2C:
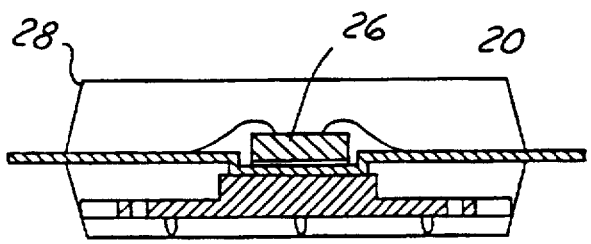
Figure 3:
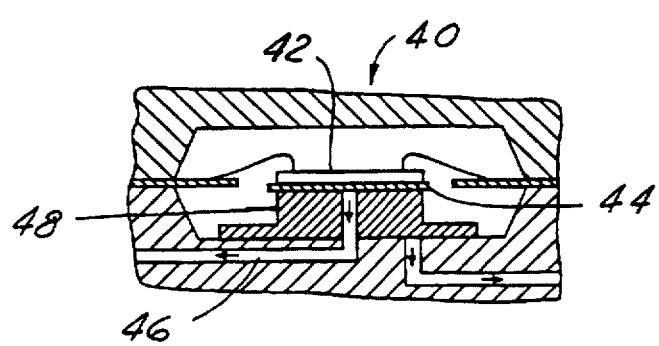
FIG. 3 is an enlarged cross-sectional view of a third prior art method in which a molding apparatus equipped with vacuum channels is used.
Figure 4A:
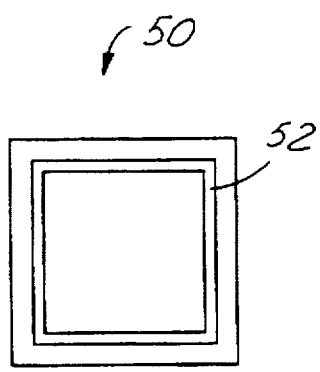
FIG. 4a is an enlarged plane view of a heat sink employed in the preferred embodiment.
Figure 4B:
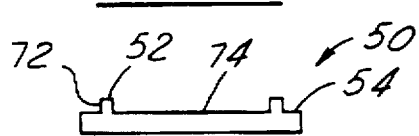
Figure 6A:
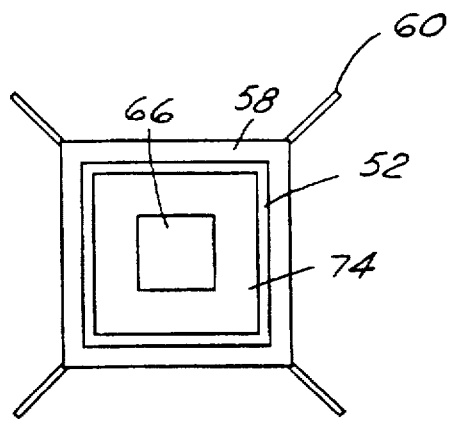
FIG. 6a is an enlarged plane view of a die-attach paddle having a heat sink and an integrated circuit chip mounted on top.
Figure 6B:
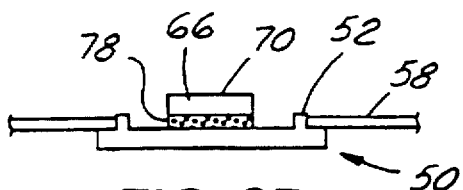
Figure 5:
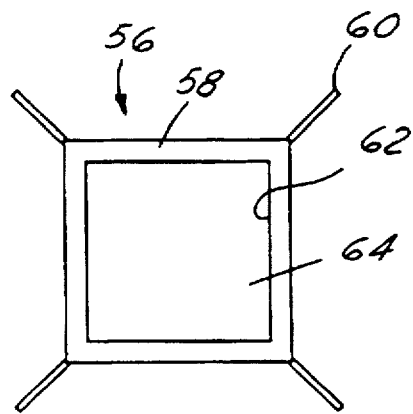
FIG. 5 is an enlarged plane view of a die-attach paddle containing an opening therein.
Figure 7:
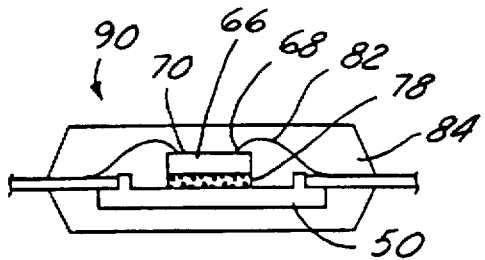
FIG. 7 is an enlarged cross-sectional view of the die-attach paddle, the heat sink, and the integrated circuit chip encapsulated in a plastic molded package.

Referring initially to FIG. 4a and 4b, wherein a plane view and a cross-sectional view of a heat sink 50 are shown, respectively. A raised ridge portion 52 is formed on the top surface 54 of the heat sink. A lead frame 56 containing a die-attach paddle 58 connected by tie bars 60 is shown in FIG. 5. The lead frame 56 can be made of any one of known materials such as cooper or copper alloy. An integrated circuit die 66 having numerous bonding pads 68 on its top surface 70, and a heat sink 50 having a top surface 54 are shown in FIGS. 6a, 6b and 7. The heat sink 50 is made of a high thermal conductivity material, usually a metal or a metal alloy. Suitable materials that can be used include copper, copper alloys, aluminum, aluminum alloys, or any other suitable materials that has high thermal conductivity.

As shown in FIGS. 4 and 7, the mechanical engagement between the heat sink 50 and the die-attach paddle 58 is an important aspect of the present invention. In order to insure a tight engagement between heat sink 50 and die-attach paddle 58, the profile 62 of the opening 64 should be substantially the same as the profile 72 of the raised ridge 52. Furthermore, the external perimeter of the raised ridge 52 should be substantially equal to the inside perimeter of the opening 62. By substantially equal, it is meant that the two perimeters should not deviate by more than ±0.1%. Within such tolerance, the two parts can be compression fitted together and maintain such tight engagement through the plastic encapsulation process.

After the heat sink 50 and the die-attach paddle 58 are compression fitted together, as shown in FIGS. 6a and 6b, an integrated circuit die 66 is bonded to the top surface 54 of the heat sink 50 in a recessed area 74 surrounded by the raised ridge 52 by an adhesive layer 78. The adhesive layer 78 has high thermal conductivity and can be cured in a short time to a maximum bond strength. The adhesive may be a polymeric based adhesive such as an epoxy, loaded with a metal filler of silver powder. The epoxy adhesive provides a short cure time and a high bond strength while silver powder improves its thermal conductivity such that heat generated in the integrated circuit die 66 can be rapidly conducted to the heat sink 50. The die bonding operation can be carried out in a pair of mold platens (not shown) by applying a pressure thereon to form a tight bond between the die 66 and the heat sink 50.

After the die bonding process, bonding wires 82 are provided between the bonding pads 68 situated on the top surface 70 of IC die 66 and the leads (not shown) on lead frame 58. This enables the connection of the IC die 66 to the outside circuit that the plastic molded package 90 is connected to. The number of bonding pads 68 situated on the top surface 70 of die 66 can be numerous and is dependent on the size of the IC die 66. After the completion of the wire bonding process, the assembly of the IC die 66, the heat sink 50, and the die-attach paddle 58 in lead frame 56 are placed in an injection mold apparatus (not shown) and a plastic material 84 is subsequently injected to completely encapsulate and to form a plastic molded package 90. The plastic encapsulation protects the various components from damages by mechanical force, by moisture, by heat and by chemicals.

Figure 8:
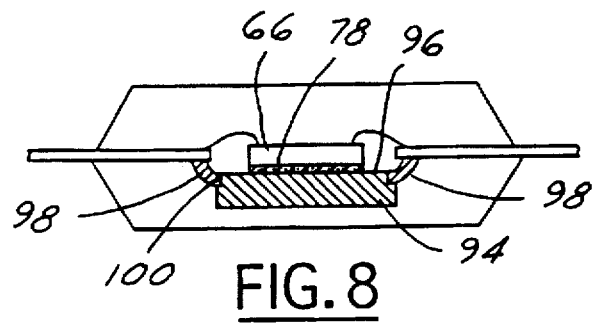
FIG. 8 is an enlarged cross-sectional view of an alternate embodiment utilizing a heat sink that has a raised top.

In a first alternate embodiment, a heat sink 94 that has a raised top 96 instead of a raised ridge 52 (shown in FIG. 6b) is used. This is shown in FIG. 8. The heat sink 94 frictionally engages the die-attach paddle 98 at the raised step 100. In this embodiment, the IC die 66 is mounted on the raised top 96 by an adhesive layer 78.

In a second alternate embodiment of the present invention (not shown), a multiple number of integrated circuit dies are bonded and encapsulated. In applications where more than one IC die is bonded to a heat sink, the substrate is first bonded to the heat sink by an adhesive layer. The adhesive can be a similar type of adhesive that is used in bonding the IC dies to the heat sink. This technique enables the bonding of two or more integrated circuit dies to a single substrate after the substrate is bonded to a heat sink. Bonding wires are then connected between the IC dies and the substrate through electrical circuits. The substrate is then connected by connecting wires to various leads on the lead frame. The method provides greater flexibility to the present invention such that it can be applied in multiple IC package applications.

While the present invention has been described in an illustrative manner, it should be understood that the terminology used is intended to be in a nature of words of description rather than of limitation.

Furthermore, while the present invention has been described in terms of a preferred and three alternate embodiments thereof, it is to be appreciated that those skilled in the art will readily apply these teachings to other possible variations of the invention.

The embodiments of the invention in which an exclusive property or privilege is claimed are defined as follows:

1. A method of assembling an integrated circuit die to a heat sink, comprising the steps of:

providing a lead frame having a die-attach paddle portion, said die-attach paddle portion having a top surface, a bottom surface, and an opening therethrough, said opening having a profile and an inside perimeter, providing a heat sink having a raised frame portion on its top surface, said raised frame portion having an external profile substantially matching the profile of the opening in said die-attach paddle and an external perimeter substantially equal to the inside perimeter of said opening, positioning said heat sink abutting said bottom surface of said die-attach paddle portion, and frictionally engaging said heat sink and said die-attach paddle portion together such that the raised frame portion on said heat sink engages the opening in said die-attach paddle portion, and pressing an integrated circuit die against a top surface of said heat sink inside said raised frame portion with an adhesive sandwiched therein between.

2. A method according to claim 1, wherein the profile of said opening in the die-attach paddle is generally a rectangular shape.

3. A method according to claim 1, wherein said heat sink having a recessed area in the raised portion inside a ridge adapted for receiving an integrated circuit chip.

4. A method according to claim 1, wherein said heat sink is made of a material that has high thermal conductivity.

5. A method according to claim 1, wherein said heat sink is made of a material selected from the group consisting of Cu, Cu alloys, Al, Al alloys and any other high thermal conductivity metals and alloys.

6. A method according to claim 1 further comprising a plastic encapsulation step to encase said die-attach paddle portion, said heat sink and said integrated circuit chip.

7. A method according to claim 6, wherein said heat sink after said plastic encapsulation process has a surface exposed to ambient to facilitate heat dissipation.

8. A method according to claim 1, wherein said adhesive is a dielectric material.

9. A method according to claim 1, wherein said adhesive is a polymeric material.

10. A method according to claim 1, wherein said adhesive is a dielectric material filled with a metal powder.

11. A method according to claim 1, wherein said frictional engagement of said heat sink with said die-attach paddle portion is achieved by pressing together the two members in a pair of metal platen.

12. A method of fabricating a plastic molded package of an electronic device, comprising the steps of:

positioning a lead frame having a die-attach paddle portion in a mold cavity, said die-attach paddle portion having a top surface and a bottom surface and an opening therethrough, said opening having a profile and an inside perimeter, providing a heat sink having a raised frame portion on its top surface, said raised frame portion having an external profile substantially matching said profile of the opening in said die-attach paddle and an external perimeter substantially equal to the inside perimeter of said opening, positioning said heat sink abutting the bottom surface of said die-attach paddle portion and frictionally engaging said heat sink and said die-attach paddle portion together such that the raised frame portion on said heat sink engages said opening in the die-attach paddle portion, pressing an integrated circuit die against a top surface of said heat sink inside said raised frame portion with an adhesive therein between, wire bonding said integrated circuit die to said lead frame, and injecting a plastic material into said mold cavity to encapsulate said lead frame, said integrated circuit die, said die-attach paddle, and said heat sink together forming a plastic molded package.

13. A method according to claim 12, wherein said heat sink is being made of a material having high thermal conductivity.

14. A method according to claim 12, wherein said heat sink is being made of a material selected from the group consisting of Cu, Cu alloys, Al, Al alloys and any other high thermal conductivity metals and alloys.

15. A method according to claim 12, wherein said heat sink encapsulated in said plastic molded package has at least one surface exposed to ambient.

16. A method according to claim 12, wherein said opening in said die-attach paddle portion has generally a rectangular shape.

17. A method according to claim 12, wherein said heat sink having a recessed area in the raised portion inside a ridge adapted for receiving an integrated circuit chip.

18. A method according to claim 12, wherein said adhesive is a dielectric material filled with a conductive powder.

19. A method according to claim 12, wherein said frictional engagement of said heat sink with said die-attach paddle portion is achieved by pressing together the two members in a pair of metal platen.

* * * * *